(12) United States Patent
Kaneda et al.

(10) Patent No.: US 10,833,574 B2
(45) Date of Patent: Nov. 10, 2020

(54) SWITCHING ELEMENT CONTROL DEVICE

(71) Applicant: Mitsubishi Electric Corporation, Tokyo (JP)

(72) Inventors: Mitsuru Kaneda, Tokyo (JP); Tetsuo Takahashi, Tokyo (JP); Shinya Soneda, Tokyo (JP); Ryu Kamibaba, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/547,627

(22) Filed: Aug. 22, 2019

(65) Prior Publication Data

US 2020/0161459 A1    May 21, 2020

(30) Foreign Application Priority Data

Nov. 15, 2018  (JP) .................. 2018-214257

(51) Int. Cl.
*H02M 1/08* (2006.01)
*H01L 29/739* (2006.01)
*H02M 7/537* (2006.01)
*H03K 17/567* (2006.01)

(52) U.S. Cl.
CPC .......... *H02M 1/08* (2013.01); *H01L 29/7397* (2013.01); *H02M 7/537* (2013.01); *H03K 17/567* (2013.01)

(58) Field of Classification Search
CPC ............... H01L 29/7397; H01L 29/407; H01L 29/8613; H02M 7/537; H02M 1/08; H02M 2001/0054; H03K 17/567
See application file for complete search history.

(56) References Cited

U.S. PATENT DOCUMENTS

| | | | | |
|---|---|---|---|---|
| 4,896,245 A | * | 1/1990 | Qualich | H02H 5/044 361/103 |
| 4,937,697 A | * | 6/1990 | Edwards | H02H 5/044 323/276 |
| 5,438,499 A | * | 8/1995 | Bonte | H02M 3/33507 323/285 |
| 5,926,012 A | * | 7/1999 | Takizawa | H03K 17/0828 323/284 |
| 5,936,387 A | * | 8/1999 | Tabata | H02M 7/538 323/225 |
| 6,049,447 A | * | 4/2000 | Roesch | H02H 9/025 361/58 |
| 8,299,767 B1 | * | 10/2012 | Tuozzolo | H03K 17/0822 323/275 |

(Continued)

FOREIGN PATENT DOCUMENTS

JP      2009-099690 A      5/2009

*Primary Examiner* — Thomas J. Hiltunen
(74) *Attorney, Agent, or Firm* — Studebaker & Brackett PC

(57) ABSTRACT

A switching element control device for controlling a switching element incorporating a reverse conducting diode is provided. The switching element control device includes: a voltage detection circuit detecting a voltage across first and second main electrodes of the switching element; a comparator circuit comparing the voltage detected by the voltage detection circuit with a threshold voltage; and a drive circuit controlling driving of the switching element. The comparator circuit controls the drive circuit so that an on signal is not provided to the switching element when the detected voltage exceeds the threshold voltage.

5 Claims, 7 Drawing Sheets

(56) References Cited

U.S. PATENT DOCUMENTS

| | | | | |
|---|---|---|---|---|
| 8,405,430 | B2* | 3/2013 | Martin | H05B 39/047 |
| | | | | 327/108 |
| 8,897,036 | B2* | 11/2014 | Chen | H02M 3/3387 |
| | | | | 363/21.02 |
| 9,166,469 | B2* | 10/2015 | Familiant | H02M 1/38 |
| 9,735,773 | B2* | 8/2017 | McIntosh | H03K 17/6871 |
| 10,281,941 | B2* | 5/2019 | Mori | G05F 1/573 |
| 2015/0035569 | A1* | 2/2015 | Miura | H03K 17/167 |
| | | | | 327/109 |
| 2019/0140630 | A1* | 5/2019 | Chen | H03K 17/08104 |
| 2019/0204889 | A1* | 7/2019 | Kaeriyama | G01K 7/01 |

* cited by examiner

F I G. 3
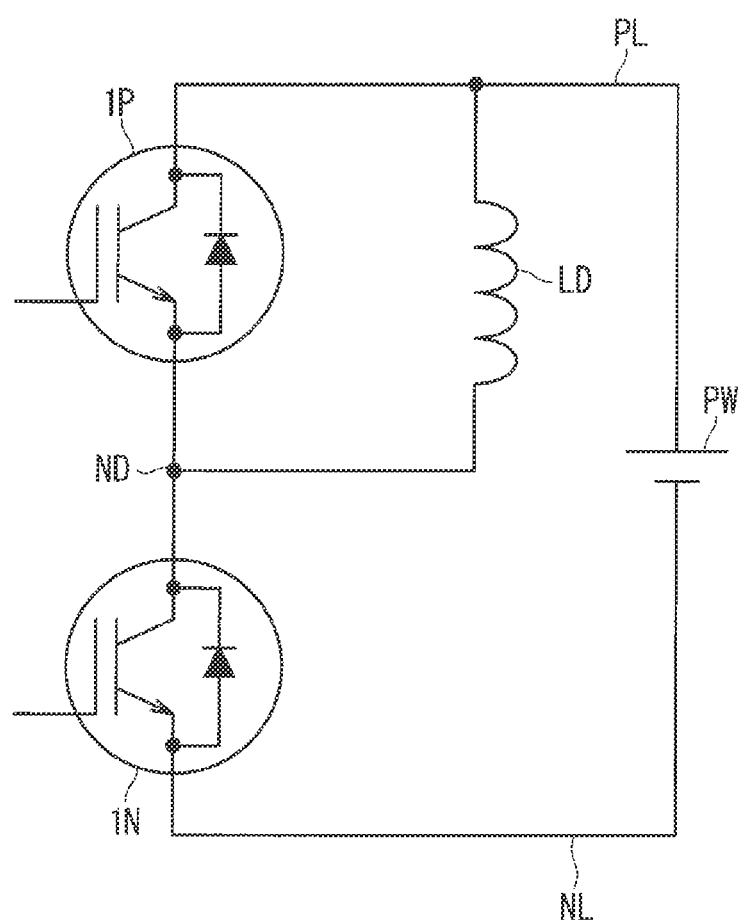

F I G 4
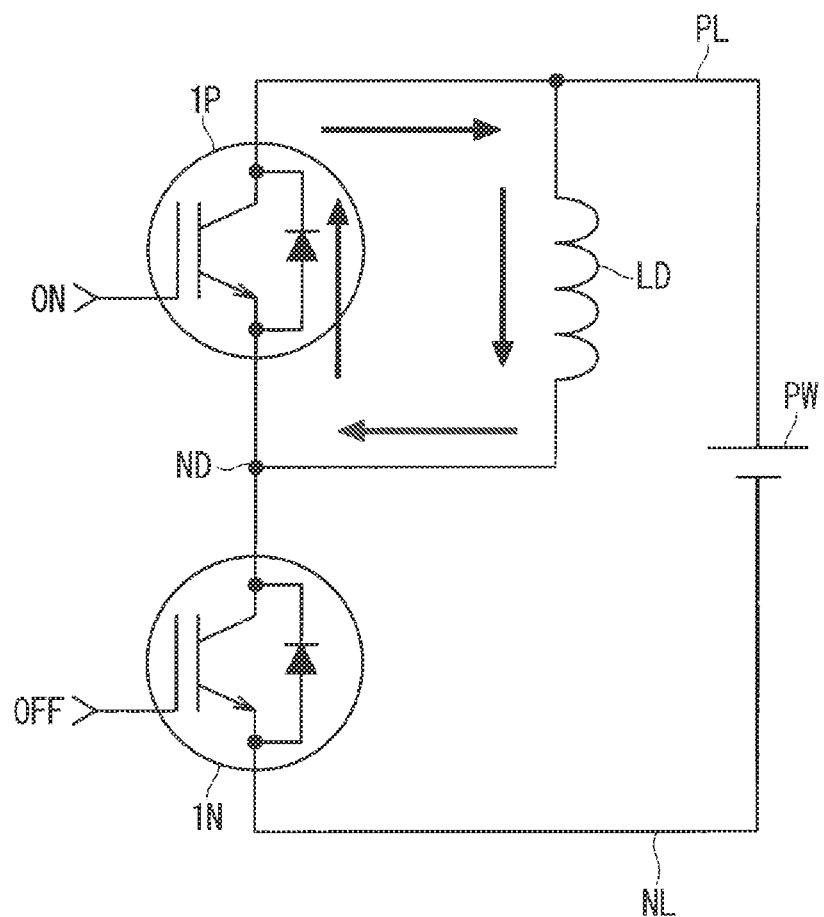

F I G. 7
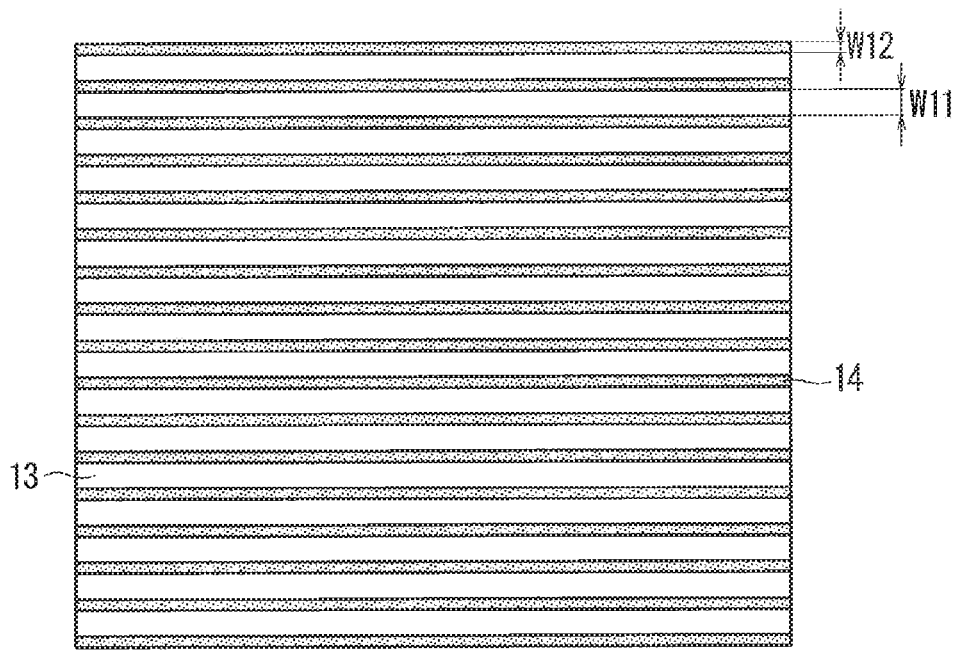
F I G. 8
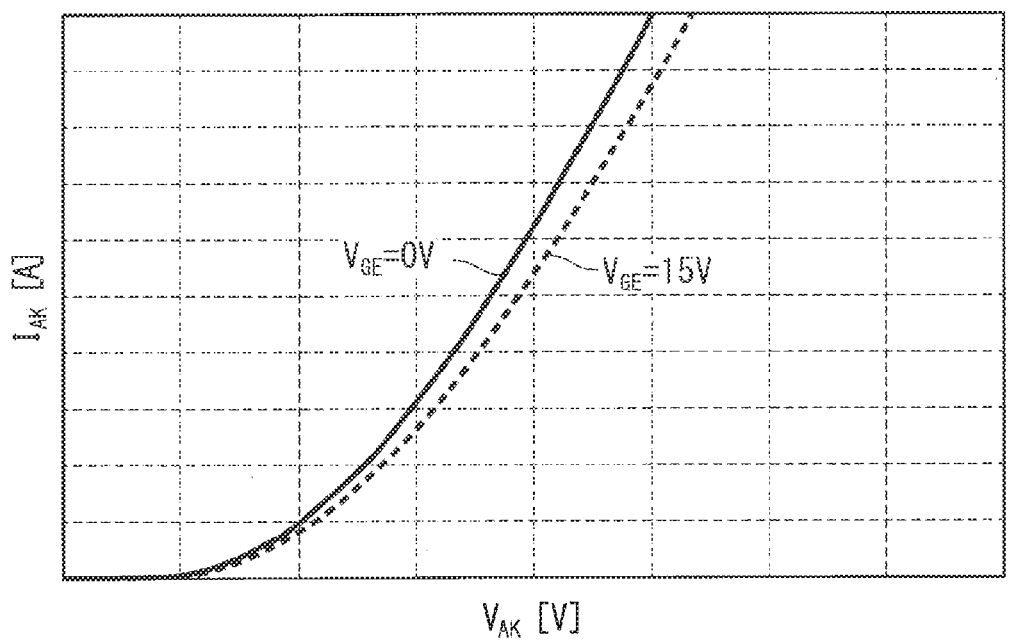

SWITCHING ELEMENT CONTROL DEVICE

BACKGROUND OF THE INVENTION

Field of the Invention

The present invention relates to a switching element control device and, in particular, to a switching element control device for controlling a switching element incorporating a reverse conducting diode.

Description of the Background Art

In recent years, an inverter circuit has widely been used for control of home appliances and industrial power apparatuses from an energy conservation perspective. The inverter circuit uses a power semiconductor device to repeat turning on and off of a voltage or a current to thereby perform power control, and mainly uses an insulated gate bipolar transistor (IGBT) from its properties when a rated voltage is 300 V or more.

The inverter circuit is often used mainly to drive an inductive load, such as an inductive motor. In this case, a counter electromotive force is generated from the inductive load, and a reverse conducting diode provided in anti-parallel with the IGBT is required to circulate a current generated from the counter electromotive force.

Although the IGBT and the reverse conducting diode are provided separately in a conventional inverter device, a reverse conducting IGBT (RC-IGBT) including the reverse conducting diode and the IGBT formed integrally onto a single chip has recently been developed and put to practical use to reduce the size and weight of the inverter device.

In the RC-IGBT, however, a phenomenon occurs which a conduction loss of the reverse conducting diode increases when the IGBT is turned on during forward operation of the reverse conducting diode. For example, Japanese Patent Application Laid-Open No. 2009-99690 (related art) discloses technology of providing a control circuit to prevent application of a gate voltage to the RC-IGBT during forward operation of the reverse conducting diode.

In the technology disclosed in Japanese Patent Application Laid-Open No. 2009-99690, however, the control functions after a current flows through the reverse conducting diode. It is thus considered that, in a state of the current not flowing through the diode, the control does not function and the conduction loss cannot be suppressed.

SUMMARY

It is an object to provide a switching element control device for suppressing a conduction loss when a reverse conducting diode incorporated in a switching element is conducting in a forward direction.

A switching element control device according to the present invention is a switching element control device for controlling a switching element incorporating a reverse conducting diode, and includes: a voltage detection circuit detecting a voltage across first and second main electrodes of the switching element; a comparator circuit comparing the voltage detected by the voltage detection circuit with a threshold voltage; and a drive circuit controlling driving of the switching element, and the comparator circuit controls the drive circuit so that an on signal is not provided to the switching element when the detected voltage exceeds the threshold voltage.

According to the above-mentioned switching element control device, the on signal is not provided to the switching element when the voltage detected by the voltage detection circuit exceeds the threshold voltage of the comparator circuit. The conduction loss when the incorporated reverse conducting diode is conducting in the forward direction can thus be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for describing a half bridge circuit of an inverter circuit;

FIG. 4 schematically illustrates a state of an inductive load and the reverse conducting diode forming a closed circuit to circulate a current;

FIG. 7 is a plan view illustrating the cell region of the RC-IGBT;

FIG. 8 shows conduction properties of the reverse conducting diode of the RC-IGBT;

DESCRIPTION OF THE PREFERRED EMBODIMENTS

Embodiment 1

Figure 1:
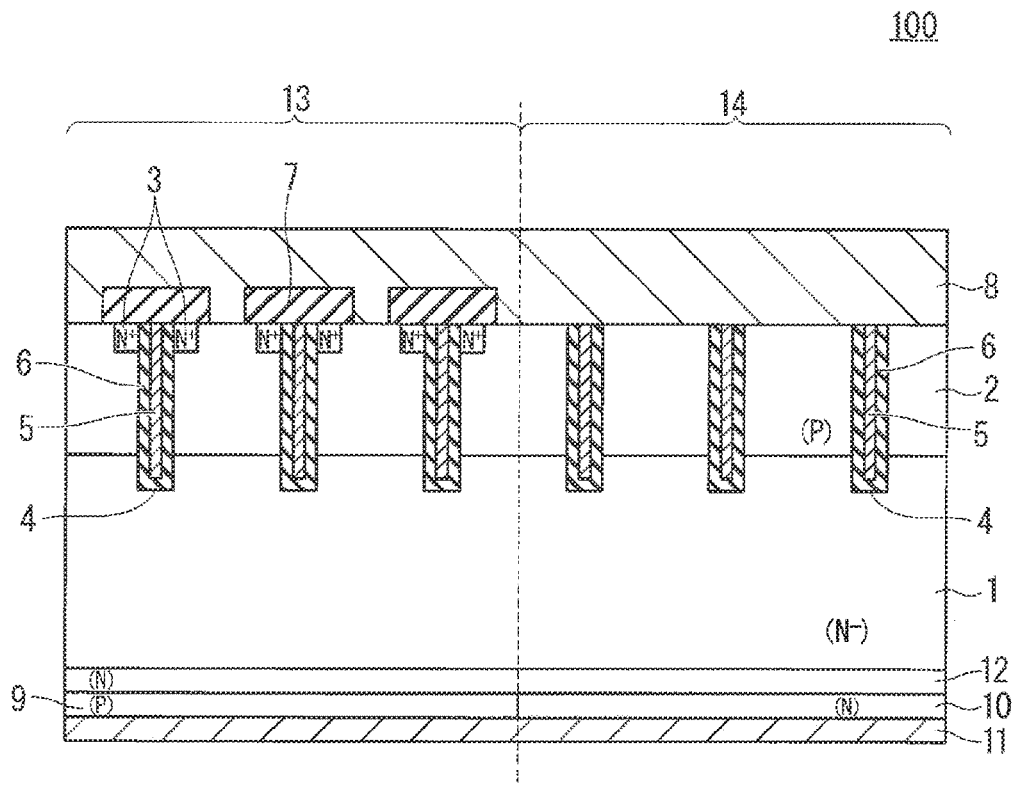
FIG. 1 is a partial cross sectional view illustrating a configuration of an RC-IGBT.

FIG. 1 is a partial cross sectional view of a cell region of a reverse conducting IGBT (RC-IGBT) 100 including a reverse conducting diode and an IGBT formed integrally.

As illustrated in FIG. 1, the RC-IGBT 100 includes a semiconductor layer 1 containing a relatively low concentration (N$^-$) of N-type impurities and a base layer 2 over the semiconductor layer 1 formed by diffusing P-type impurities. Over the base layer 2 in an IGBT region 13 that is a region of formation of a switching element, a plurality of emitter layers 3 each containing a relatively high concentration (N$^+$) of N-type impurities are provided selectively.

In the IGBT region 13, which is the region of formation of the IGBT, a plurality of trenches 4 are provided to penetrate the emitter layers 3 and the base layer 2 in their thickness directions, and reach the semiconductor layer 1 from outermost surfaces of the emitter layers 3. The trenches 4 are also provided in a diode region 14 that is a region of formation of the reverse conducting diode, but only penetrate the base layer 2. FIG. 1 illustrates a single IGBT region 13 and a single diode region 14. FIG. 1, however, is a partial view, and a plurality of IGBT regions 13 and a plurality of diode regions 14 are alternately provided in the cell region as will be described later.

A trench gate electrode 5 of the IGBT is embedded in each of the trenches 4 with an insulating gate oxide film 6 therebetween. During on operation of the IGBT, a channel region is formed in a surface of the base layer 2 being in contact with the gate oxide film 6 on a side surface of the trench 4, that is, in the surface of the base layer 2 interposed between the emitter layer 3 and the semiconductor layer 1 on a side surface of the gate oxide film 6.

In the IGBT region 13, upper surfaces of the trench gate electrodes 5 and their surroundings are covered with insulating films 7. An emitter electrode 8 (a first main electrode) is provided on an upper surface of the base layer 2 including the insulating films 7, and is in contact with the emitter layers 3. The emitter electrode 8 is also provided on the upper surface of the base layer 2 including the upper surfaces of the trench gate electrodes 5 in the diode region 14, and functions as an anode electrode of the reverse conducting diode in the diode region 14.

In a main surface (back surface) of the semiconductor layer 1 opposite a side on which the base layer 2 is provided, a collector layer 9 containing P-type impurities is provided in the IGBT region 13, and a cathode layer 10 containing N-type impurities is provided in the diode region 14. A buffer layer 12 containing N-type impurities is provided on the collector layer 9 and the cathode layer 10.

On the main surface (back surface) of the semiconductor layer 1 opposite a side on which the emitter electrode 8 is provided, a collector electrode 11 (a second main electrode) is provided to cover the collector layer 9 and the cathode layer 10. The collector electrode 11 functions as a cathode electrode of the reverse conducting diode in the diode region 14.

Figure 2:
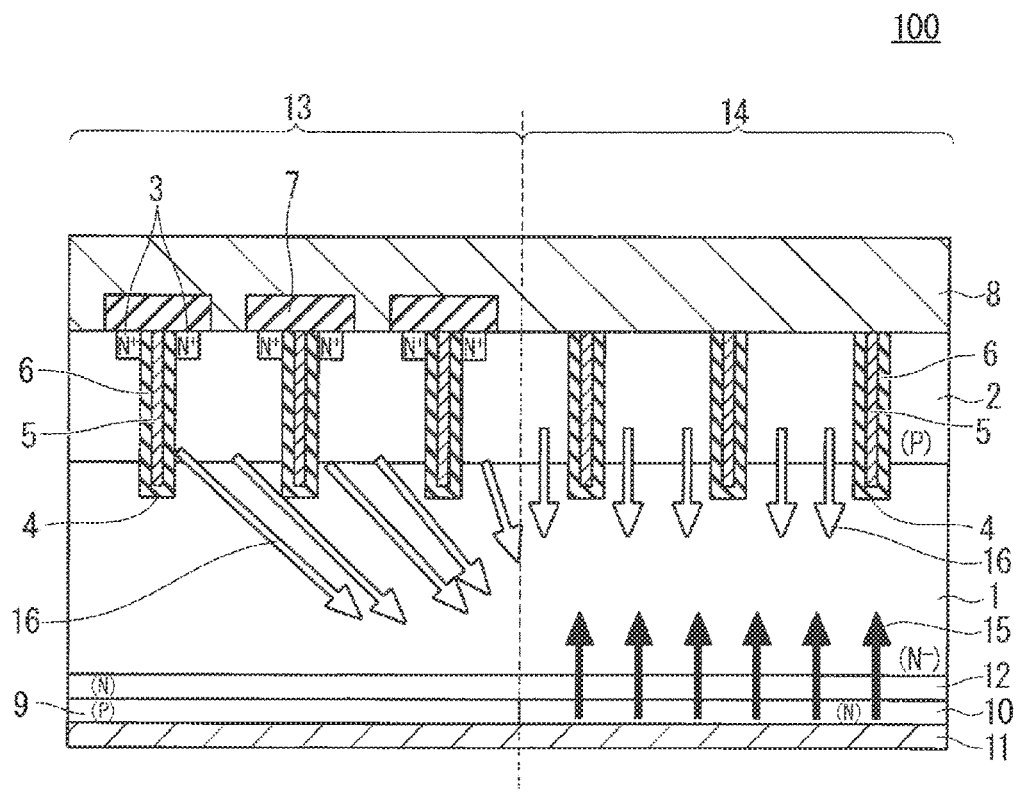
FIG. 2 is a cross sectional view for describing conducting operation of a reverse conducting diode of the RC-IGBT.

Conducting operation of the reverse conducting diode of the RC-IGBT 100 will be described next with use of FIG. 2. When a forward bias voltage, that is, an anode voltage ($V_{AK}$), exceeding a threshold of the reverse conducting diode is applied across the emitter electrode 8 and the collector electrode 11, electrons 15 are injected from the cathode layer 10 into the semiconductor layer 1, and, further, holes 16 are injected from the base layer 2 into the semiconductor layer 1. This greatly reduces a forward voltage ($V_F$), and allows a current to flow from the anode to the cathode.

In a case where the RC-IGBT 100 is incorporated into a bridge circuit to configure an inverter circuit, a voltage (an on signal) is sometimes applied across the emitter electrode 8 and the trench gate electrodes 5 in a state of the reverse conducting diode conducting in a forward direction. Such a case will be described below.

FIG. 3 shows a simplified half bridge circuit of one arm of the inverter circuit. As shown in FIG. 3, the half bridge circuit is configured such that an RC-IGBT 1P and an RC-IGBT 1N are connected in series with each other between a high side (P side) main power supply line PL connected to a positive electrode of a power supply PW and a low side (N side) main power supply line NL connected to a negative electrode of the power supply PW.

A of the RC-IGBT 1P is connected to the main power supply line PL, and an emitter of the RC-IGBT 1P is connected to a collector of the RC-IGBT 1N. An emitter of the RC-IGBT 1N is connected to the train power supply line NL. A connection node ND at which the RC-IGBT 1P and the RC-IGBT 1N are connected to each other is an output node of the half bridge circuit. An inductive load LD is connected between the connection node ND and the main power supply line PL.

A gate signal to a P side transistor of the inverter circuit and a gate signal to an N side transistor of the inverter circuit are typically provided complementarily, and are thus produced using a logic NOT circuit. That is to say, when an on signal is input as the gate signal to the P side transistor, an off signal obtained by reversing the gate signal to the P side transistor through the logic NOT circuit is input as the gate signal to the N side transistor.

When a forward conducting current flows through the reverse conducting diode of the RC-IGBT 1P in a case where the RC-IGBT 100 illustrated in FIG. 1 is used as each of the RC-IGBT 1P and the RC-IGBT 1N, the inductive load LD and the reverse conducting diode form a closed circuit to circulate the current as shown by arrows in FIG. 4. In this case, if the RC-IGBT 1N is turned on, the current flows through the RC-IGBT 1N, and stops flowing through the reverse conducting diode of the RC-IGBT 1P. That is to say, the RC-IGBT 1N has to be off to allow the current to flow through the reverse conducting diode of the RC-IGBT 1P. When the gate signal to the RC-IGBT 1N is the off signal through the logic NOT circuit, the gate signal to the RC-IGBT 1P is the on signal. As described above, in a period during which the reverse conducting diode is conducting in the forward direction, the on signal is sometimes input into the IGBT connected in parallel with the reverse conducting diode.

When the on signal is input into the IGBT, the channel region is formed in the surface of the base layer 2 being in contact with the gate oxide film 6 on the side surface of the trench 4, as described with use of FIG. 1. This state is schematically illustrated in FIG. 5.

Figure 5:
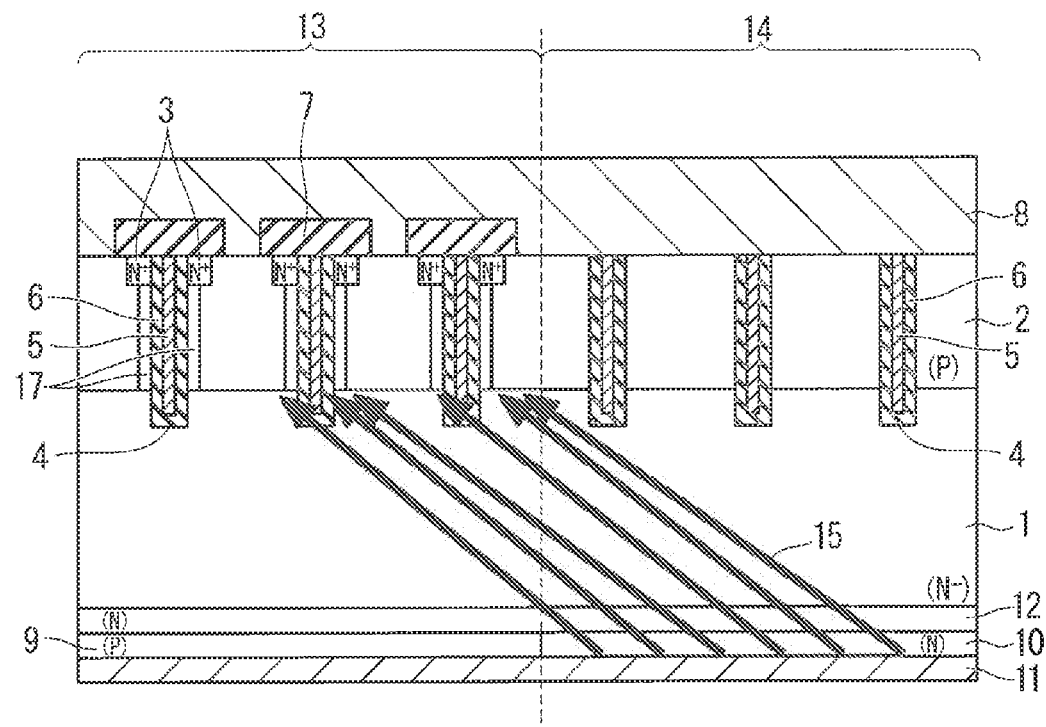
FIG. 5 schematically illustrates a state of a channel region being formed in the RC-IGBT.

As illustrated in FIG. 5, snapback occurs as the electrons 15 injected from the cathode layer 10 into the semiconductor layer 1 flows not to the base layer 2 but to the channel region 17 formed in the surface of the base layer 2 being in contact with the gate oxide film 6 on the side surface of the trench 4. The forward bias voltage, that is, the anode voltage ($V_{AK}$), exceeding the threshold of the reverse conducting diode greatly increases to increase the conduction loss of the reverse conducting diode.

The layout of the IGBT regions 13 and the diode regions 14 has an influence on the increase in forward bias voltage. The influence will be described below.

Figure 6:
FIG. 6 is a plan view illustrating a cell region of the RC-IGBT.

FIGS. 6 and 7 are plan views each illustrating the cell region of the RC-IGBT while changing the width in plan view of the IGBT regions 13 and the diode regions 14.

In FIGS. 6 and 7, the IGBT regions 13 and the diode regions 14 illustrated in FIG. 1 are reduced in size and illustrated as striped regions, and various electrodes including the trench gate electrodes 5 and the like are omitted.

In FIG. 6, the width W1 of each of the IGBT regions 13 is several times greater than the width W2 of each of the diode regions 14, and is several times or more greater than the width W11 of each of the IGBT regions 13 illustrated in FIG. 7. The width W2 of each of the diode regions 14 is formed to be several times or more greater than the width W12 of each of the diode regions 14 illustrated in FIG. 7.

Figure 9:
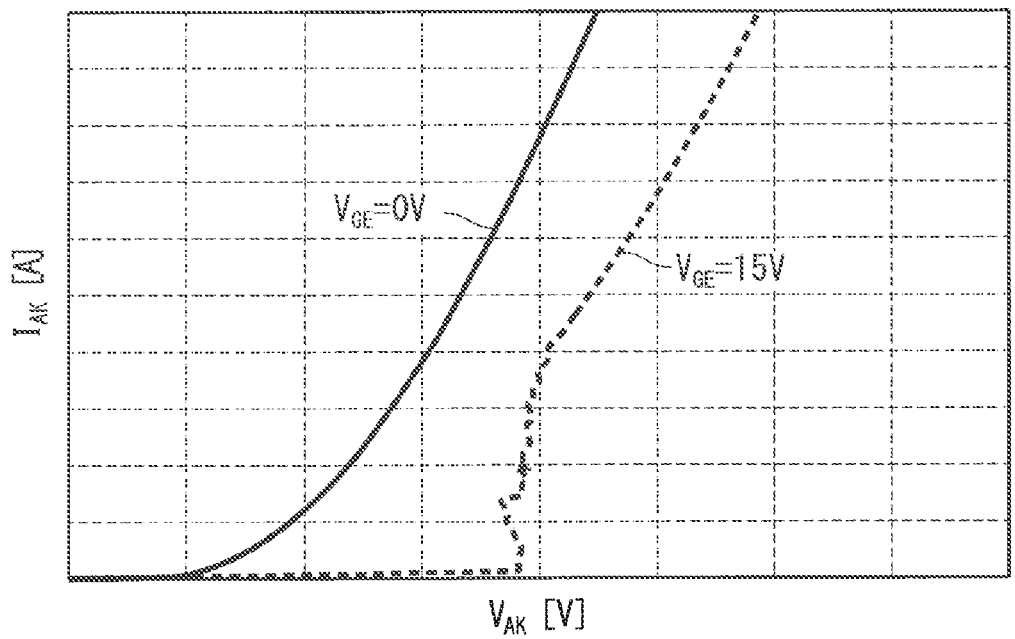
FIG. 9 shows the conduction properties of the reverse conducting diode of the RC-IGBT.

The conduction properties of the reverse conducting diodes of the RC-IGBTs having the layouts illustrated in FIGS. 6 and 7 are respectively shown in FIGS. 8 and 9. In each of FIGS. 8 and 9, the horizontal axis represents the anode voltage ($V_{AK}$) [V], and the vertical axis represents a conducting current $I_{AK}$ [A]. In each of FIGS. 8 and 9, the properties when a gate-emitter voltage, that is, a gate voltage $V_{GE}$, is not applied across the emitter electrode and the gate electrode of the RC-IGBT ($V_{GE}$=0 V) during conduction of the reverse conducting diode are shown in a solid line, and the properties when a gate voltage $V_{GE}$ of 15 V, which is a normal drive voltage, is applied ($V_{GE}$=15 V) are shown in a broken line.

In FIG. 8, the properties when $V_{GE}$=0 V and the properties when $V_{GE}$=15 V do not greatly differ from each other, and are both typical diode properties.

On the other hand, in FIG. 9, the properties when 0 V are the typical diode properties, but the properties when $V_{GE}$=15 V are properties when the snapback occurs. The snapback continues to occur until the voltage exceeds a built-in potential of a pn junction of the diode. A current starts to flow only after the voltage exceeds the built-in potential of the pn junction. In FIG. 9, the conducting current $I_{AK}$ starts to flow after the anode voltage increases approximately to the middle of FIG. 9. A snapback voltage has a value almost four times greater than a value of a turn-on voltage when $V_{GE}$=0 V. The conduction loss increases as the current increases while maintaining a high voltage.

As described above, when a stripe width of each of the IGBT regions 13 and the diode regions 14 is extremely small, the snapback occurs upon application of the gate voltage $V_{GE}$ to the RC-IGBT during conduction of the reverse conducting diode, and the conduction loss of the reverse conducting diode increases.

The IGBT regions 13 and the diode regions 14 are thus each required to have at least a certain width. A smaller stripe width is advantageous in view of heat dissipation, but the stripe width in the RC-IGBT cannot be reduced as the conduction loss of the diode increases due to the occurrence of the snapback.

As described above, in the related art, a sense element sensing a diode current is provided to the RC-IGBT so that the gate voltage is not applied to the RC-IGBT during forward operation of the reverse conducting diode, and a current flowing through the reverse conducting diode is detected to perform control. The control thus does not function during the occurrence of the snapback during which the current does not flow through the reverse conducting diode.

<Device Configuration>

Figure 10:
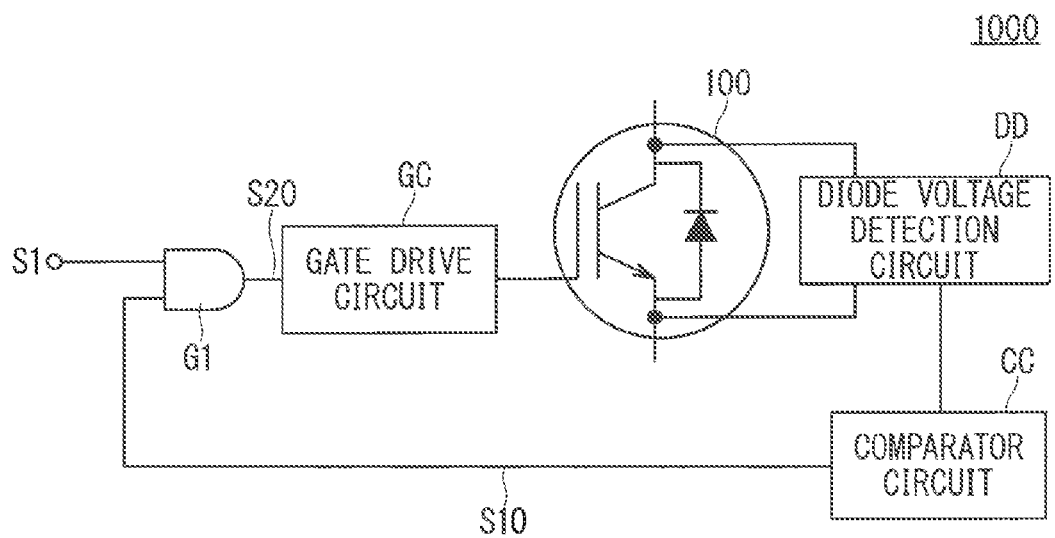
FIG. 10 is a block diagram showing a configuration of a control device according to Embodiment 1 of the present invention.

FIG. 10 is a block diagram showing a configuration of a control device 1000 according to Embodiment 1 of the present invention. As shown in FIG. 10, the control device 1000 includes, for example, the RC-IGBT 100 illustrated in FIG. 1 as a switching element targeted for control, and includes a diode voltage detection circuit DD, a comparator circuit CC, a logic AND circuit G1, and a gate drive circuit GC.

The diode voltage detection circuit DD detects an ode-cathode voltage ($V_{AK}$) of the reverse conducting diode incorporated in the RC-IGBT 100, and outputs the detected voltage to the comparator circuit CC. The diode voltage detection circuit DD is herein configured not to output the voltage to the comparator circuit CC when a negative bias (a reverse bias) is applied as the voltage $V_{AK}$, that is, when a positive bias (a forward bias) is applied as a collector-emitter voltage ($V_{CE}$) of the IGBT.

The comparator circuit CC is configured to input, as a low potential (low) signal, an output signal S10 output from the comparator circuit CC into one input of the logic AND circuit G1 when the voltage $V_{AK}$ as input exceeds a predetermined threshold voltage, and to output the output signal S10 as a high potential (high) signal in the other cases.

A gate signal S1 is input into the other input of the logic AND circuit G1. The logic AND circuit G1 performs AND operation of the gate signal S1 and the output signal S10 from the comparator circuit CC, and inputs an output signal S20 based on the results of operation into the gate drive circuit GC.

The gate drive circuit GC outputs the on signal or the off signal for the RC-IGBT 100 based on the output signal S20 input from the logic AND circuit G1.

The RC-IGBT 100 has a configuration in which the IGBT regions 13 and the diode regions 14 described with use of FIG. 7 each have a smaller stripe width to increase heat dissipation, and the snapback occurs when the gate voltage is applied to the RC-IGBT 100 during conduction of the reverse conducting diode.

<Operation>

Operation of the control device 1000 shown in FIG. 10 will be described next. Assume that the diode voltage detection circuit DD inputs the detected voltage into the comparator circuit CC at all times when the negative bias (reverse bias) is applied as the collector-emitter voltage ($V_{CE}$) of the RC-IGBT 100, that is, when the positive bias (forward bias) is applied as the anode-cathode voltage ($V_{AK}$) of the reverse conducting diode, but does not output the detected voltage to the comparator circuit CC when the positive bias is applied as the voltage $V_{CE}$.

This prevents normal switching operation of the RC-IGBT 100 as a transistor from being inhibited by the comparator circuit CC.

When the gate voltage is not applied to the RC-IGBT 100 ($V_{GE}$=0V) even if the positive bias is applied as the voltage $V_{AK}$ of the reverse conducting diode incorporated in FIG. 10, control performed by the control device 1000 does not function as the properties are typical diode properties as shown by the solid line in FIG. 9.

On the other hand, when the positive bias is applied as the voltage $V_{AK}$ of the reverse conducting diode, and the gate voltage is applied to the RC-IGBT 100 ($V_{GE}$=15V), the snapback occurs as shown by the broken line in FIG. 9, and continues to occur until the voltage exceeds the built-in potential of the pn junction of the reverse conducting diode.

When the positive bias is applied as the voltage $V_{AK}$ of the reverse conducting diode, the diode voltage detection circuit DD inputs the voltage $V_{AK}$ into the comparator circuit CC at all times. The comparator circuit CC thus inputs, as the low signal, the output signal S10 into one input of the logic AND circuit G1 when the voltage $V_{AK}$ as input exceeds a reference voltage of the comparator circuit CC due to the snapback.

As long as the low signal is input into the logic AND circuit G1, the output signal S20 of the logic AND circuit G1 is the low signal regardless of whether the gate signal S1 input into the logic AND circuit G1 is the high signal or the low signal.

The gate drive circuit GC is configured not to operate when the output signal S20 of the logic AND circuit G1 is the low signal, so that the gate voltage is not applied to the RC-IGBT 100. This results in typical diode properties during conduction of the reverse conducting diode as in a case where the gate voltage is not applied to the RC-IGBT 100 ($V_{GE}$=0V) as shown by the solid line in FIG. 9, and can reduce the conduction loss of the reverse conducting diode.

As described above, in the control device 1000 according to Embodiment 1, the anode-cathode voltage is detected in a period during which the snapback occurs, that is, in a period during which the current is required to flow through the reverse conducting diode but the voltage does not exceed the built-in potential of the pn junction, and feedback control is performed so that the gate voltage is not applied to the RC-IGBT 100. The conduction loss caused when the incorporated reverse conducting diode is conducting in the forward direction can thus be suppressed.

As described above, the RC-IGBT 100 has the configuration in which the IGBT regions 13 and the diode regions 14 described with use of FIG. 7 each have a smaller stripe width to increase heat dissipation. Compared with a case where the IGBT regions 13 and the diode regions 14 each have a large stripe width as described with use of FIG. 6, heat generated by the conduction loss of the reverse conducting diode can be dissipated efficiently.

In a case where an area ratio of the IGBT regions 13 to the diode regions 14 is 7:3, for example, the IGBT regions having an area ratio of 70% function as heat dissipation regions of the reverse conducting diode during conduction of the reverse conducting diode having an area ratio of 30%. The effect of heat dissipation thus increases with decreasing area ratio of the reverse conducting diode.

On the other hand, when the area ratio of the IGBT regions 13 to the diode regions 14 is reversed, heat dissipation efficiency of the IGBT regions 13 increases. For applications in inverters, however, a period during which a current flows through the diode is typically shorter than a period during which a current flows through the IGBT. In a case where the RC-IGBT is designed for inverter applications, the IGBT regions are set to have a greater area ratio than the diode regions.

In addition, the RC-IGBT 100 has the configuration in which the IGBT regions 13 and the diode regions 14 each have a smaller stripe width to make the snapback more likely to occur on purpose. This enables reliable detection of the snapback voltage and quick control of the gate voltage.

In a case where the IGBT regions 13 and the diode regions 14 are arranged in stripes as illustrated in FIGS. 6 and 7, the snapback depends on the stripe width of each of the diode regions. As the stripe width decreases, the snapback voltage increases to enable reliable detection of the snapback voltage.

<Examples of Configurations of Diode Voltage Detection Circuit and Comparator Circuit>

Figure 11:
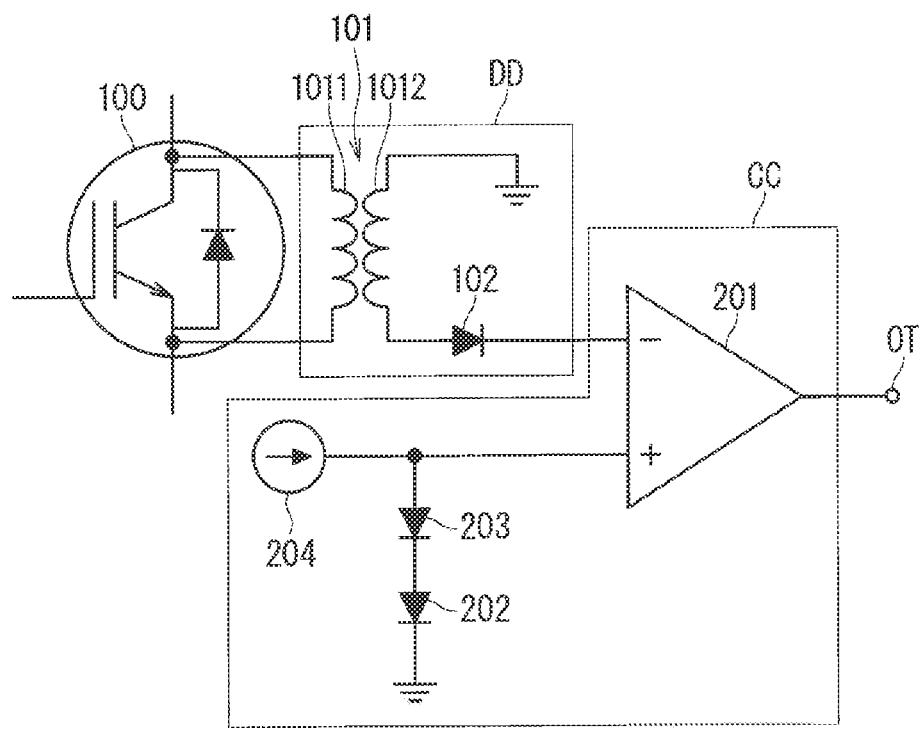
FIG. 11 shows one example of a configuration of a diode voltage detection circuit and a configuration of a comparator circuit of the control device according to Embodiment 1 of the present invention.

Examples of configurations of the diode voltage detection circuit DD and the comparator circuit CC shown in FIG. 10 are shown in FIG. 11.

As shown in FIG. 11, the diode voltage detection circuit DD can have a configuration in which a primary winding 1011 of a pulse transformer 101 having a winding ratio of 1:1, for example, is connected to the collector (cathode) and the emitter (anode) of the RC-IGBT 100, and an output of a secondary winding 1012 of the pulse transformer 101 is input into the comparator circuit CC.

The pulse transformer 101 functions as an isolator as it converts an electrical signal into a magnetic signal for transmission. Thus, in a case where the RC-IGBT 100 is a high side transistor, insulation between the RC-IGBT 100 on a high side and the comparator circuit CC and the like on a low side can be maintained. The gate drive circuit GC is typically insulated by a photocoupler or a pulse transformer, and thus a main circuit as a bridge circuit including the RC-IGBT 100 and a control circuit, such as the comparator circuit CC and the logic AND circuit G1, are electrically insulated from each other.

One terminal of the secondary winding 1012 of the pulse transformer 101 is connected to an anode of a clamping diode 102, the other terminal of the secondary winding 1012 is connected to a ground potential, and a cathode of the clamping diode 102 is connected to the comparator circuit CC.

The clamping diode 102 is provided not to output the detected voltage to the comparator circuit CC when the negative bias is applied as the anode-cathode voltage of the RC-IGBT 100, that is, when the positive bias is applied as the collector-emitter voltage of the IGBT. When the negative bias is applied as the anode-cathode voltage of the RC-IGBT 100, a voltage is applied to the clamping diode 102 in a blocking direction, and thus the detected voltage is not output to the comparator circuit CC.

The comparator circuit CC includes a comparator 201 having an inverting input terminal (− terminal) connected to the cathode of the clamping diode 102 and a non-inverting input terminal (+ terminal) connected to a current source 204. An output terminal OT of the comparator 201 is connected to one input of the logic AND circuit G1 (FIG. 10).

The non-inverting input terminal of the comparator 201 is connected to a ground potential through a diode 202 for generation of the reference voltage, but a built-in potential of the clamping diode 102 is added to the voltage detected by the diode voltage detection circuit DD as the clamping diode 102 is provided to the diode voltage detection circuit DD. Thus, to the non-inverting input terminal of the comparator 201, a diode 203 having the same properties as the clamping diode 102 is connected in series with the diode 202 to precede the diode 202.

As described above, in a case where a pn junction diode formed by a pn junction is used to generate the reference voltage of the comparator 201, the built-in potential of the pn junction has temperature properties, and thus the threshold voltage of the comparator 201 also has temperature properties.

The snapback voltage during conduction of the reverse conducting diode of the RC-IGBT 100 also has temperature properties, and the snapback voltage decreases particularly at a high temperature. By using the threshold voltage of the comparator 201 as a built-in potential voltage of each of the diodes 202 and 203, the voltage decreases at a high temperature as in the reverse conducting diode of the RC-IGBT 100, and the comparator 201 can operate even at a high temperature.

The built-in potential of the pn junction does not vary greatly if the diodes 202 and 203 used for generation of the reference voltage of the comparator 201 and the reverse conducting diode of the RC-IGBT 100 are manufactured using the same semiconductor material, such as silicon, and thus a configuration as described above is possible.

<Another Example of Comparator Circuit>

Figure 12:
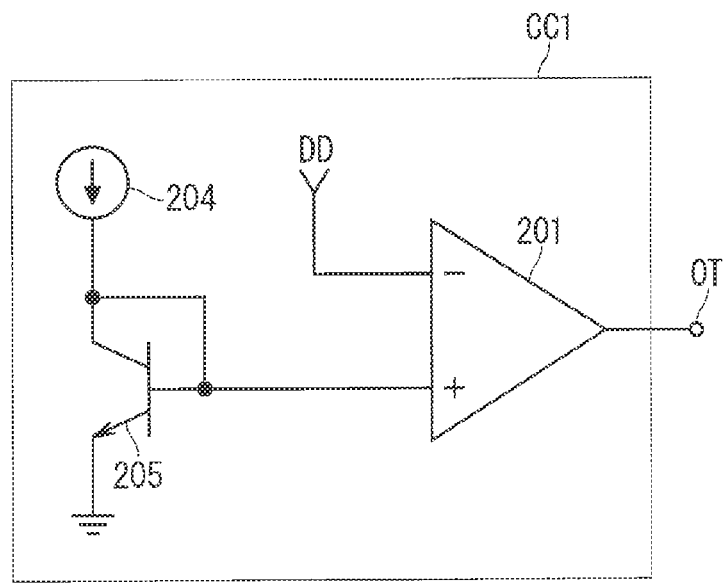
FIG. 12 shows another example of the configuration of the comparator circuit of the control device according to Embodiment 1 of the present invention.

In the comparator circuit CC of the control device 1000 according to Embodiment 1 described above, the reference voltage of the comparator 201 is generated using the diodes 202 and 203 connected in series with each other, but a base voltage of a collector-base shorted bipolar transistor 205 may be used as the reference voltage as in a comparator circuit CC1 shown in FIG. 12.

That is to say, a base of the collector-base shorted bipolar transistor 205 is connected to the non-inverting input terminal of the comparator 201, and the base of the bipolar transistor 205 is connected to the current source 204.

As there is a pn junction between the base and an emitter of the bipolar transistor 205, the base voltage has temperature properties, and thus the threshold voltage of the comparator 201 has temperature properties.

By using the threshold voltage of the comparator 201 as the built-in potential voltage of the pn junction between the base and the emitter of the bipolar transistor 205, the voltage decreases at a high temperature as in the reverse conducting diode of the RC-IGBT 100, and the comparator 201 can operate even at a high temperature.

Embodiments of the present invention can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A switching element control device for controlling a switching element incorporating a reverse conducting diode, the switching element control device comprising:
    a voltage detection circuit detecting a voltage across first and second main electrodes of the switching element;
    a comparator circuit comparing the voltage detected by the voltage detection circuit with a threshold voltage; and
    a drive circuit controlling driving of the switching element, wherein
    the comparator circuit controls the drive circuit so that an on signal is not provided to the switching element when the detected voltage exceeds the threshold voltage, and
    the voltage detection circuit inputs the detected voltage into the comparator circuit when a positive bias for the reverse conducting diode is applied across the first and second main electrodes, and does not input the detected voltage into the comparator circuit when a positive bias for the switching element is applied across the first and second main electrodes.

2. The switching element control device according to claim 1, wherein
    the voltage detection circuit includes a pulse transformer having a winding ratio of 1:1, and
    a primary winding of the pulse transformer is connected to the first and second main electrodes, and an output of a secondary winding of the pulse transformer is provided to the comparator circuit through a diode connected to block the detected voltage when the positive bias for the switching element is applied.

3. The switching element control device according to claim 1, wherein
    when the detected voltage exceeds the threshold voltage, the comparator circuit inputs, as a low potential signal, an output signal into a logic AND circuit provided to precede the drive circuit, and
    when an output signal of the logic AND circuit is the low potential signal, the drive circuit does not operate.

4. The switching element control device according to claim 1, wherein
    the comparator circuit uses the threshold voltage as a built-in potential voltage of a pn junction.

5. A switching element control device controlling a switching element incorporating a reverse conducting diode, the switching element control device comprising:
    a voltage detection circuit detecting a voltage across first and second main electrodes of the switching element;
    a comparator circuit comparing the voltage detected by the voltage detection circuit with a threshold voltage; and
    a drive circuit controlling driving of the switching element, wherein
    the comparator circuit controls the drive circuit so that an on signal is not provided to the switching element when the detected voltage exceeds the threshold voltage,
    the switching element comprising:
        a region of formation of the reverse conducting diode and a region of formation of the switching element alternately arranged in stripes in plan view, and
        a stripe width of the region of formation of the reverse conducting diode and a stripe width of the region of formation of the switching element are set so that snapback occurs when a positive bias for the reverse conducting diode is applied across the first and second main electrodes in a state of the on signal being provided to the switching element.

* * * * *